United States Patent [19]

Hayashi et al.

[11] Patent Number: 4,980,308

[45] Date of Patent: Dec. 25, 1990

[54] METHOD OF MAKING A THIN FILM TRANSISTOR

[75] Inventors: Hisao Hayashi; Takeshi Matsushita, both of Shinagawa, Japan

[73] Assignee: Sony Corporation, Tokyo, Japan

[21] Appl. No.: 433,449

[22] Filed: Nov. 13, 1989

Related U.S. Application Data

[63] Continuation of Ser. No. 265,798, filed as PCT JP88/00078 on Jan. 29, 1988, published as WO88/05961 on Aug. 11, 1988, abandoned.

[30] Foreign Application Priority Data

Jan. 30, 1987 [JP] Japan .............................. 62-12445[U]
Sep. 25, 1987 [JP] Japan .............................. 62-241932[U]

[51] Int. Cl.⁵ ............................................. H01L 21/70
[52] U.S. Cl. ......................................... 437/41; 437/29; 437/40; 437/62; 437/83; 437/86; 437/186; 437/915; 437/974; 357/23.7
[58] Field of Search ........................ 437/29, 34, 40, 41, 437/83, 86, 186, 225, 249, 974, 915; 357/23.7

[56] References Cited

U.S. PATENT DOCUMENTS

| | | | |
|---|---|---|---|
| 3,624,463 | 11/1971 | Davidsohn | 437/974 |
| 4,131,909 | 12/1978 | Matsuda et al. | 437/974 |
| 4,139,401 | 2/1979 | McWilliams et al. | 437/974 |
| 4,468,857 | 9/1984 | Christian et al. | 437/225 |
| 4,784,970 | 11/1988 | Solomon | 437/974 |

FOREIGN PATENT DOCUMENTS 2752344 5/1979 Fed. Rep. of Germany .
55-179053 12/1980 Japan .
56-88354 7/1981 Japan .

*Primary Examiner*—Brian E. Hearn
*Assistant Examiner*—Tom Thomas
*Attorney, Agent, or Firm*—Hill, Van Santen, Steadman & Simpson

[57] ABSTRACT

The present invention relates to a semiconductor device in which a semiconductor element is formed on a semiconductor layer (3) supported on a substrate (1) via at least insulating layers (2) and (4) as shown in FIGS. 1 and 2 and a method of fabricating the same. The semiconductor layer (3) has wiring layers (5) and (6) on both surfaces thereof, thus leading itself well for increasing the density of wiring and for increasing the operation speed in a large-scale integrated circuit device.

1 Claim, 3 Drawing Sheets

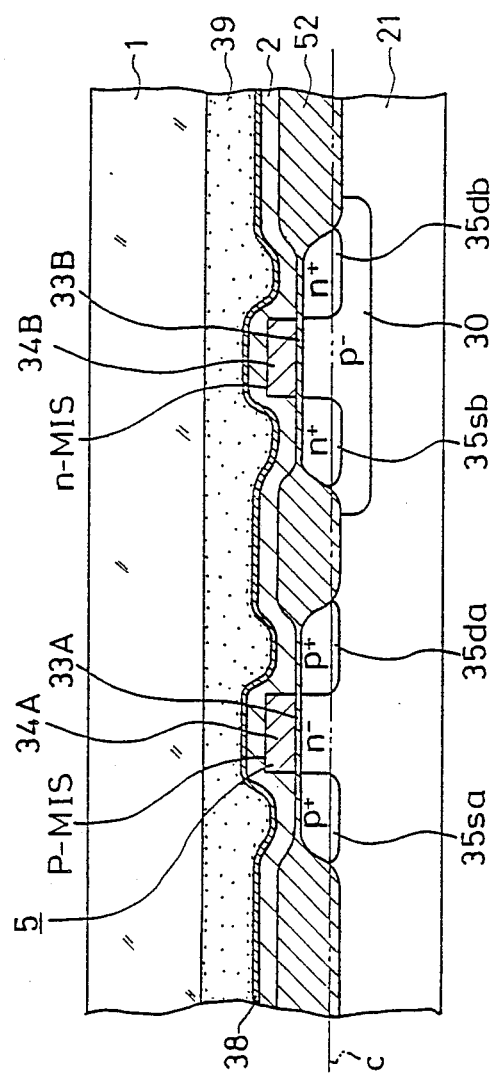
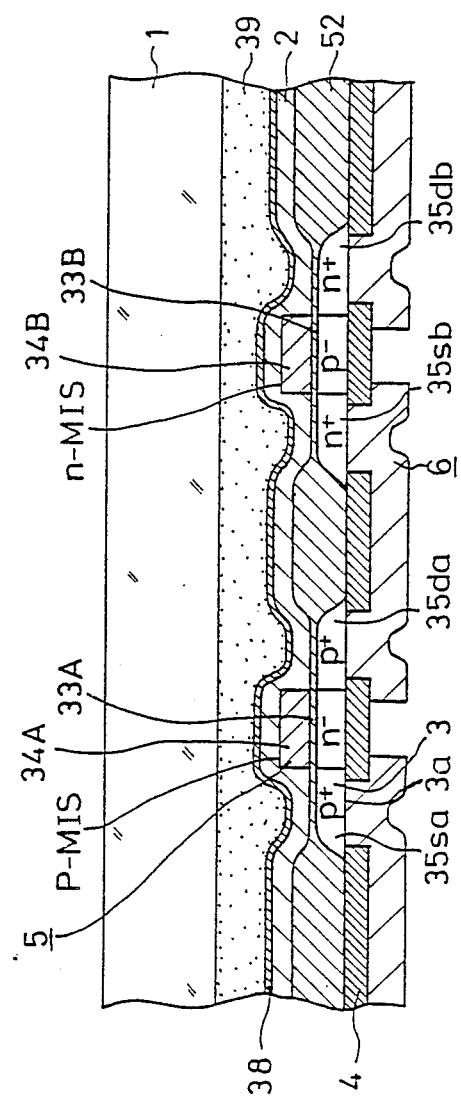
FIG. 2A
FIG. 2B

METHOD OF MAKING A THIN FILM TRANSISTOR

This is a continuation, of application Ser. No. 265,798, filed as PCT JP88/00078 on Jan. 29, 1988, published as WO88/05961 on Aug. 11, 1988, now abandoned.

TECHNICAL FIELD

The present invention relates to a semiconductor device using a thin film semiconductor layer and a method of fabricating the same and particularly to a semiconductor device which has high-density wiring layers such as a gate electrode, a wiring electrode and so on formed on both sides of a semiconductor layer and a method of fabricating the same.

Also, the present invention relates to a semiconductor device which is formed on a semiconductor layer on an insulating substrate and is capable of high-speed operation and a method of fabricating the same.

BACKGROUND ART

As a semiconductor device using a thin film semiconductor layer formed on an insulating substrate, the present applicant has proposed an MIS transistor having a 100 to 750 angstrom thick-semiconductor layer which can be operated at high speed as is disclosed in U.S. Patent applications, Ser. Nos. 683860 and 683932.

Further, JOURNAL OF ELECTROCHEMICAL SOCIETY: SOLID-STATE SCIENCE AND TECHNOLOGY (Journal of Electrochemical Society: SOLID-STATE SCIENCE AND TECHNOLOGY), Vol. 120, No. 11, pp. 1563 to 1566 discloses a method in which a silicon substrate is bonded on an insulating substrate and then the silicon substrate is lapped or polished to have a predetermined thickness.

This kind of semiconductor device formed on the insulating substrate can be operated at high speed because a parasitic capacitance between its semiconductor region and the substrate can be reduced.

Even this kind of semiconductor device is, however, requested to make its wiring in a multi-layer fashion or to make its wiring in a very small layout pattern with the increase of integration of semiconductor elements. In this case, the wiring is made only on the upper portion of the semiconductor layer so that due to a difference by the insulating film or contact-hole between the wiring on the under layer and the upper layer. There is caused a step-cut in the wiring on the upper layer. As a result, there is then a problem that reliability of the semiconductor device is lowered.

DISCLOSURE OF INVENTION

The present invention is to provide a semiconductor device which can be operated at high speed because it has a less parasitic capacitance for a substrate.

Also, the present invention is to provide a semiconductor device formed on a thin film semiconductor layer supported on an insulating substrate and a method of fabricating the same.

Particularly, the present invention is to provide an MIS transistor formed on a thin film semiconductor layer supported on an insulating substrate and a method of fabricating the same.

Further, the present invention is to provide a semiconductor device which can increase the density of wiring and a method of fabricating the same.

Further, the present invention is to provide a semiconductor device which can prevent reliability from being lowered by a step-cut in the multi-layer wiring and a method of fabricating the same.

Furthermore, the present invention is to provide a semiconductor device in which the wiring of semiconductor elements can be made with an increased freedom and a method of fabricating the same.

In addition, the present invention is to provide a semiconductor device having a multi-layer wiring which can be made with smaller pattern by making the upper portion of the wiring flat and a method of fabricating the same.

In order to achieve the above-mentioned objects, the present invention is to provide a semiconductor device in which semiconductor elements are formed on a semiconductor layer supported on a substrate via at least an insulating layer and a method of fabricating the same. The semiconductor layer has wiring layers formed on both surfaces thereof, thus leading itself well for increasing the density of wiring and for increasing the operation speed in a large-scale integrated circuit device.

BRIEF DESCRIPTION OF DRAWINGS

FIG. 1 is a process diagram of an embodiment of a semiconductor device according to the present invention and a method of fabricating the same and FIG. 2 is a process diagram of another embodiment of a semiconductor device according to the present invention and a method of fabricating the same.

BEST MODE FOR CARRYING OUT THE INVENTION

Figure 1A:
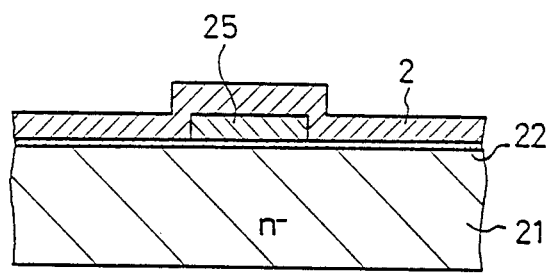

A method of obtaining a double-side gate type MIS semiconductor device which can improve the effective carrier mobility will be described with reference to FIG. 1. In this case, as shown in FIG. 1A, a single crystal silicon semiconductor substrate 21 of, for example, n− type is provided. A gate insulating film 22 is formed on its one major surface by means of a surface thermal oxidation treatment or the like, on which a first gate electrode 25, i.e., a first wiring layer 5 formed of a polycrystalline silicon layer having low resistivity is formed with a predetermined pattern, for example, with a predetermined wiring pattern covering the first gate electrode 25. The first wiring layer 5, i.e., the first gate electrode 25 in the illustrated example is formed by depositing a polycrystalline silicon layer on the entire surface by, for example, chemical vapor deposition method (CVD method) or the like and patterning the same by means of a photolithography or the like.

Figure 1B:
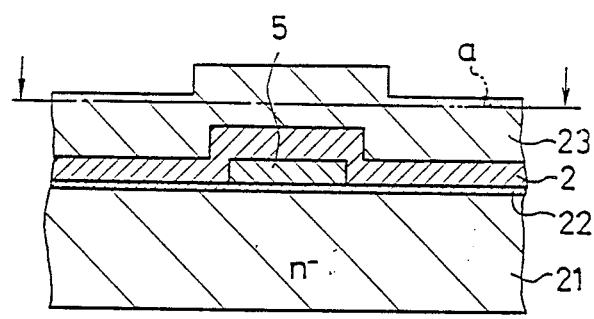

As shown in FIG. 1B, an intermediate layer 23 made of, for example, a polycrystalline silicon or the like of relatively large thickness is deposited on an insulating layer 2 by means of the CVD method or the like.

Figure 1C:
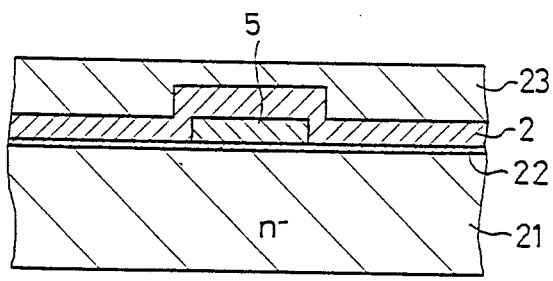

Then, as shown in FIG. 1C, the intermediate layer 23 is etched flat from its surface side to the position shown by a chain line a in FIG. 1B by techniques such as, for example, mechanical grading, mechanical and chemical polishing or the like.

Figure 1D:
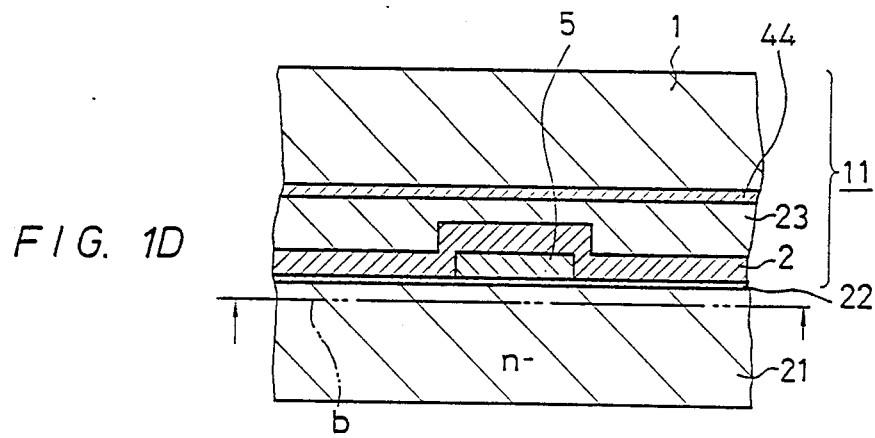

As shown in FIG. 1D, an insulating layer 44 made of, for example, an SiO$_2$ or the like is formed on the flat surface of the intermediate layer 23 by a surface thermal oxidation process or the like. On this insulating layer, a single crystal or polycrystalline silicon substrate 1 is bonded or the substrate 1 made of polycrystalline silicon is grown by means of the CVD method or the like. Then, the semiconductor substrate 21 is supported on a supporting member 11 which includes this substrate 1.

Figure 1E:
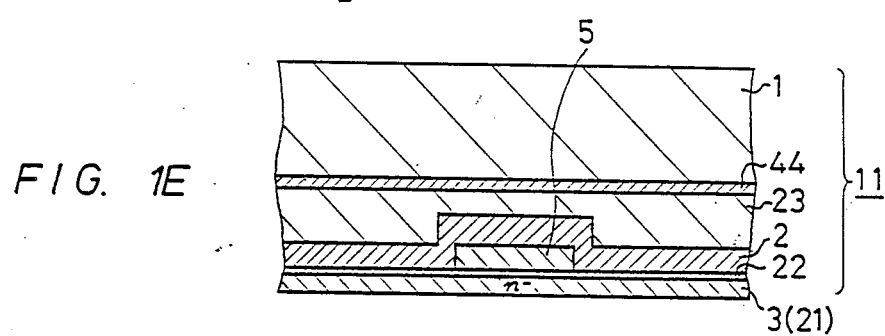

As shown in FIG. 1E, the semiconductor substrate 21 is etched flat from the opposite side of the supporting member 11 to the position shown by a chain line b in FIG. 1D by means of mechanical grading, mechanical and chemical polishing or etching and other well-known techniques, thus forming a semiconductor layer 3 having a sufficiently thin film thickness.

Figure 1F:
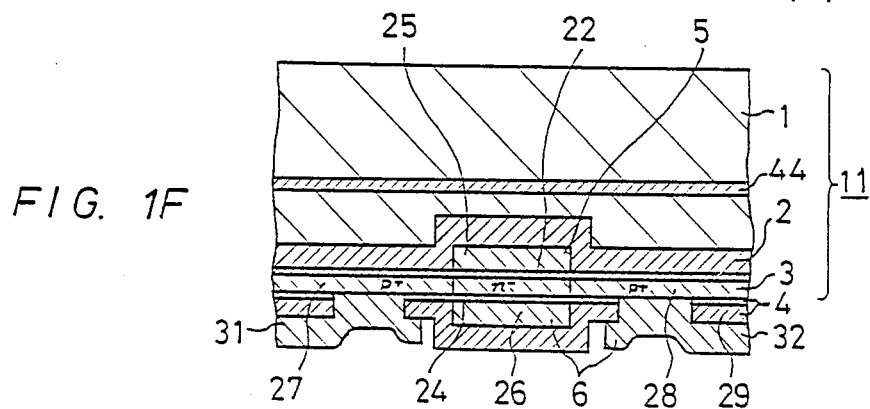

Then, as shown in FIG. 1F, the surface of the semiconductor layer 3 opposite to the surface facing the supporting member 11 is treated by, for example, a thermal oxidation process thereby to deposit a second gate insulating film 24 on that surface. On the second gate insulating film 24, there is formed a second gate electrode 26 made of a polycrystalline silicon layer of low resistivity which is formed as at least a part of a second wiring layer 6 at its position opposing the first gate electrode 25 by, for example, a method similar to that of forming the afore-mentioned first gate electrode 25. Thereafter, using this second gate electrode 26 as a mask for ion implantation, a p-type impurity of conductivity type different from that of the semiconductor layer 3 is injected into the semiconductor layer, thus forming a source region 27 and a drain region 28 of low resistivity. While in this case the source region 27 and the drain region 28 are formed with the employment of the gate electrode 26 as a mask, similarly to the MIS semiconductor device shown in FIG. 2, the first gate electrode 25 in FIG. 1A may be used as a mask to form the source region 27 and the drain region 28. Next, an insulating layer 29 of $SiO_2$ or the like is formed on the entire surface to protect the surface and electrode windows are bored therethrough at positions of, for example, the respective source region 27 and drain region 28 and a source electrode 31 and a drain electrode 32, for example, are deposited on these regions 27 and 28 in ohmic-contact.

These electrodes 31 and 32 can be formed simultaneously by the photolithography technique after Al is vapor-deposited on the front surface. These electrodes constitute a part of the second wiring layer 6.

Thus, the double-side gate-type MIS semiconductor device can be obtained, in which the first wiring layer 5 including the first gate electrode 25 is formed on one surface of the semiconductor layer 3 and the second wiring layer 6 including the second gate electrode 26, the source electrode 31, the drain electrode 32 or the like is formed on the other surface of the semiconductor layer.

Another embodiment of a semiconductor device according to the present invention will be described next with reference to FIG. 2. In the figure, there is shown a complementary type structure, i.e., so-called C-MIS structure portion of an n-channel type MIS and a p-channel type MIS in an MIS integrated circuit. In this case, as shown in FIG. 2A, there is provided a semiconductor substrate, for example, an n-type single crystal silicon semiconductor substrate 21 of high resistivity. This semiconductor substrate has a $p^-$ type selective region 30 selectively formed on its one major surface at its portion, where an n-channel MIS is finally formed, by means of ion implantation method or diffusion method, etc. Then, a relatively-thick insulating layer 52 made of such as $SiO_2$ or the like for making the region inactive is formed on so-called field portions, i.e., other portions than so-called active regions where semiconductor elements, i.e., the n-channel MIS and the p-channel MIS, in this embodiment, are finally formed by a selective thermal oxidation process or the like, respectively. This selective thermal oxidation process is effected by a well-known technique in which a nitride layer, for example, is selectively formed on a semiconductor element forming portion and is oxidation-processed as an oxidation mask.

Thereafter, the anti-oxidation mask is removed and gate-insulating films 33A and 33B, each being formed of an $SiO_2$ oxidation film having a predetermined thickness, are formed on the element forming portions where the insulating layer 52 is not formed by means of, for example, thermal oxidation. On these gate-insulating films, there are formed gate electrodes 34A and 34B which are formed of polycrystalline silicon layers of low resistivity as described hereinbefore.

Further, though not shown, wiring portions or the like are extended from these gate electrodes to form the first wiring layer 5.

Then, the selective region 30 which will form one element forming portion is covered with a photoresist and this photoresist, the gate electrode 34A and the thick insulating layer 52 are used as masks to inject p-type impurity of conductivity type different from that of the substrate 21 by means of ion implantation process, thus forming a source region 35sa and a drain region 35da.

Next, removing the photoresist layer on the other element forming portion, i.e., the region 30, covering the element forming portion in which the source region 35sa and the drain region 35da are formed with a photoresist and using the gate electrode 34B, the thick insulating layer 52 and the photoresist as masks, ion implantation of n-type impurity of conductivity type different from that of the region 30 is performed to form a source region 35sb and a drain region 35db. In this way, the p-channel type MIS (p-MIS) and the n-channel type MIS (n-MIS) are formed on the common substrate 21. An insulating layer 2 such as a phosphor glass layer or the like having gettering effect of, for example, impurity is deposited on the whole surface on which the semiconductor elements such as the p-MIS and n-MIS and so on are formed respectively. A surface protection insulating layer 38 such as a nitride layer or the like formed by a plasma CVD method so as to have humidity-proof effect is deposited on the entire surface of the insulating layer. The substrate 1 having, for example, insulating property is deposited on the surface protection insulating layer through a bonding agent 39. The bonding agent 39 may be polyimide resin or glass having flowability, i.e., so-called spin-on-glass.

In this case, the substrate 1 may be formed of a relatively-inexpensive glass substrate which is not required to have heat-proof property. Alternatively, the substrate 1 may be formed of a substrate in which an insulating layer such as an $SiO_2$ layer or the like is formed on a semiconductor substrate such as silicon or the like regardless of crystalline property.

Thereafter, the substrate 21 is etched flat to the position shown by a chain line c in FIG. 2A from the side opposite to the substrate 1 by means of, for example, RIE (reactive ion etching) process or the like, thus forming a semiconductor layer 3 in which the respective semiconductor elements, i.e., the p-MIS and the n-MIS in the figure are separated from each other by the insulating layer 52 as shown in FIG. 2. The method for reducing the thickness of the semiconductor substrate 21 is not limited to the above-mentioned one but a mechanical grinding method may be employed in which the insulating layer 52 is used as a grinding stopper.

Then, as shown in FIG. 2B, an insulating layer 4 made of such as SiO₂ or the like is deposited, according to the CVD method or the like, on an exposed surface 3a which is formed by etching the semiconductor layer 3 in which the p-MIS and the n-MIS are separated by the insulating layer 52 and to which they are opposed. Electrode windows or wiring windows are respectively formed therethrough on the source and drain regions 35sa, 35da, 35sb and 35db, thus forming the second wiring layer 6. This wiring layer 6 can be formed with a predetermined pattern by means of the patterning through the photolithography after Al, for example, was deposited on the whole surface. Thus, the wiring layers 5 and 6 are formed on both surfaces of the semiconductor layer 3. These wiring layers 5 and 6 are connected to each other by providing a connecting region (not shown) in, for example, the field region at the same time when the region 30 or regions 35sa and 35da or regions 35sb and 35db are formed in the semiconductor layer 3, specifically, the semiconductor substrate 21 in advance and by connecting predetermined portions of the first and second wiring layers 5 and 6 to this connecting region in ohmic contact.

With the arrangement of this embodiment, since the circuit elements, for example, the p-MIS and the n-MIS are respectively formed on the semiconductor layer 3 and the wiring layers 5 and 6 are respectively formed on both surfaces thereof, it is avoided that the step by the concave and convex portions is formed on the surface in the case where the wiring layers are laminated. Also, the surfaces on which the respective wiring layers 5 and 6 are deposited are made relatively flat.

As described above, according to the present invention, since the first and second wiring layers 5 and 6 are deposited on both surfaces of the semiconductor layer 3, the surfaces on which the wiring layers 5 and 6 are deposited can be made comparatively flat. Accordingly, it is possible to avoid that the wiring stage is broken off by the unevenness such as the step or the like produced by the plurality of wirings. Also, since the two-surface i.e., double surface wiring structure is employed, the layout of the wiring pattern can be made with a large spare just like the case of the multi-layer wiring. Thus, as compared with a case where the wiring layer is formed on the single surface, the very small wiring pattern can be alleviated so that the resultant lowered reliability such as the disconnection of wiring or the like can be avoided.

Further, when in the embodiment shown in FIG. 1 the substrate 1 forming the supporting member 11 is formed by the CVD method, there is then an advantage that the occurrence of pin-hole and the occurrence of stress when the semiconductor layer 3 and the substrate 1 are bonded can be alleviated. Thus, the reliability can be improved much more.

In the embodiment explained in connection with FIG. 2, since such a manufacturing process is made possible that the insulating substrate 1 is bonded after the semiconductor element is formed, the substrate 1 is not subjected to the process for forming the semiconductor element, i.e., the heating process at high temperature. Thus, the material of the substrate 1 can be selected with a large freedom. By way of example, a relatively inexpensive glass substrate or the like may be used.

In the above-mentioned embodiments, the semiconductor element is formed on the semiconductor substrate 21 such as the silicon substrate or the like and the substrate 21 is bonded on the insulating substrate and is then etched from its rear wall so as to leave a certain thickness therein. In some case, various modifications and variations are effected for the fabricating method and the structure as follows. The insulating layer 4 such as the SiO₂ or the like is formed on the silicon substrate 21 and the semiconductor layer 3, for example, the silicon layer is formed on the insulating layer. Then, the semiconductor element having one wiring layer 5 such as the gate electrode or the like is formed on the silicon layer. Finally, the insulating substrate 1 is bonded thereon and the substrate 21 is etched away until the insulating layer 4 is exposed.

We claim:

1. In a method of fabricating a semiconductor device consisting of a thin film semiconductor formed on an insulating substrate, comprising the steps of forming on a first major surface of a semiconductor substrate, a first insulating film, forming a first wiring layer which does not adjoin said semiconductor substrate on said insulating film, forming said insulating substrate on said first wiring layer, removing said semiconductor substrate from its second major surface side to form said thin film semiconductor layer, forming a second insulating film on said thin film semiconductor layer, forming a second thin semiconductor layer on said second insulting film, forming a gate film on said second thin semiconductor layer, forming a second gate on said gate film, using said second gate as a mask for ion implantation to form p and n source and drain regions, forming an insulating layer over said source and drain regions, and forming electrodes connected to said source and drain regions.

* * * * *